(12) United States Patent
Viereck et al.

(10) Patent No.: US 11,125,801 B2
(45) Date of Patent: Sep. 21, 2021

(54) METHOD AND APPARATUS FOR MONITORING THE LOSS FACTOR OF CAPACITOR BUSHINGS

(71) Applicant: Maschinenfabrik Reinhausen GmbH, Regensburg (DE)

(72) Inventors: Karsten Viereck, Regensburg (DE); Junliang Wu, Regensburg (DE); Ulrich Sundermann, Dortmund (DE)

(73) Assignee: MASCHINENFABRIK REINHAUSEN GMBH, Regensburg (DE)

( * ) Notice: Subject to any disclaimer, the term of this patent is extended or adjusted under 35 U.S.C. 154(b) by 154 days.

(21) Appl. No.: 16/487,444

(22) PCT Filed: Feb. 22, 2018

(86) PCT No.: PCT/EP2018/054398
§ 371 (c)(1),
(2) Date: Aug. 21, 2019

(87) PCT Pub. No.: WO2018/158135
PCT Pub. Date: Sep. 7, 2018

(65) Prior Publication Data
US 2020/0057103 A1 Feb. 20, 2020

(30) Foreign Application Priority Data

Feb. 28, 2017 (DE) .......... 102017104110.9

(51) Int. Cl.
*G01R 31/12* (2020.01)
*G01R 15/06* (2006.01)
(Continued)

(52) U.S. Cl.
CPC ......... *G01R 31/1245* (2013.01); *G01R 15/06* (2013.01); *G01R 27/2694* (2013.01);
(Continued)

(58) Field of Classification Search
None
See application file for complete search history.

(56) References Cited

U.S. PATENT DOCUMENTS 3,942,099 A * 3/1976 Freygang ............... G01R 15/14
323/358
6,028,430 A * 2/2000 Frielingsdorf ..... G01R 31/1227
324/519
(Continued)

FOREIGN PATENT DOCUMENTS

CN 104122490 A 10/2014
DE 10037432 A1 2/2002
(Continued)

OTHER PUBLICATIONS

English translation of WO2015071253 A1 (Year: 2015).*
(Continued)

*Primary Examiner* — Jermele M Hollington
(74) *Attorney, Agent, or Firm* — Leydig, Voit & Mayer, Ltd.

(57) ABSTRACT

A method monitors capacitor bushings for an AC mains. The mains has first-third phases, associated with first-third mains lines, capacitor bushings, and mains voltages. Each capacitor bushing has a conductor, surrounded by foil, connecting its mains line. The method includes: at a first instant, for each phase: a first reference voltage phasor is determined; and a foil voltage present between the respective foil and ground potential is detected and a corresponding first foil voltage phasor is determined; at a second instant, for each of the phases: a second reference voltage phasor is determined; the foil voltage is detected and a second foil voltage phasor is determined; for each capacitor bushing: a loss factor change is calculated based on the respective reference voltages and foil phasors and those of the adjacent capaci- (Continued)

tive bushing; and a monitoring signal is generated based on a comparison of the loss factor and a tolerance value.

17 Claims, 5 Drawing Sheets

(51) Int. Cl.
*G01R 27/26* (2006.01)
*H01G 4/35* (2006.01)
*G01R 31/64* (2020.01)
*G01R 31/62* (2020.01)

(52) U.S. Cl.
CPC .............. *G01R 31/62* (2020.01); *G01R 31/64* (2020.01); *H01G 4/35* (2013.01)

(56) References Cited

U.S. PATENT DOCUMENTS

| | | | | |
|---|---|---|---|---|
| 6,873,159 | B2 * | 3/2005 | Koch ................. | G01R 27/2605 324/519 |
| 9,759,761 | B2 * | 9/2017 | Wu ......................... | G01R 15/06 |
| 9,945,896 | B2 * | 4/2018 | Watson .............. | G01R 31/1263 |
| 2003/0184325 | A1 * | 10/2003 | Koch ................. | G01R 27/2605 324/713 |
| 2016/0252564 | A1 * | 9/2016 | Wu ..................... | G01R 31/1263 324/552 |
| 2021/0141031 | A1 * | 5/2021 | Viereck .............. | G01R 27/2605 |

FOREIGN PATENT DOCUMENTS

| | | | | |
|---|---|---|---|---|
| DE | 102004027349 | A1 | 12/2005 | |
| DE | 102017104109 | A1 * | 8/2018 | ......... G01R 27/2605 |
| EP | 0747715 | A2 | 12/1996 | |
| EP | 3070483 | A1 | 9/2016 | |
| EP | 3069359 | B1 * | 1/2020 | ......... G01R 31/1263 |
| WO | WO 2015071253 | A1 | 5/2015 | |

OTHER PUBLICATIONS

Koch, et al.: "A New Method for On-Line Monitoring of Bushings and Partial Discharges of Power Transformers," *International Conference on Condition Monitoring and Diagnosis*:1205-1208 (Sep. 23, 2012) XP032312763.

Juiyun, et al.: "Research of On-Line Monitoring Method for Insulation Condition of Power Transformer Bushing," *Biomedical Photonics and Optoelectronic Imaging*, 9903: 99031T-99031T (Jan. 26, 2016) XP060063504.

* cited by examiner

METHOD AND APPARATUS FOR MONITORING THE LOSS FACTOR OF CAPACITOR BUSHINGS

CROSS-REFERENCE TO PRIOR APPLICATIONS

This application is a U.S. National Phase Application under 35 U.S.C. § 371 of International Application No. PCT/EP2018/054398, filed on Feb. 22, 2018, and claims benefit to German Patent Application No. DE 10 2017 104 110.9, filed on Feb. 28, 2017. The International Application was published in German on Sep. 7, 2018 as WO 2018/158135 under PCT Article 21(2).

FIELD

The invention relates to a method and a device for monitoring capacitor bushings for a three-phase alternating current mains.

BACKGROUND

Electrical apparatus for alternating current mains such as, for example, power transformers and chokes are usually connected with the mains lines of alternating current mains with the help of capacitor bushings. Since failure or breakdown of these capacitor bushings can be connected with serious consequences such as, for example, damage or destruction of the electrical apparatus and resulting failures of the energy supply, it is known to monitor relevant characteristic variables of the capacitor bushings, such as, for example, capacitances and loss factors, in operation. In known methods for loss factor monitoring, various influencing factors such as, for example, the high voltage applied to the capacitor bushings or temperature fluctuations in operation have a significant effect on the detected characteristic values and thus hamper reliable monitoring.

DE 10 2004 027 349 A1 describes a method of determining the loss factor of insulation of a high-voltage bushing. The high-voltage bushing has liners for de-energising an electric field, in which case an external terminal at the potential of a first liner and at least one internal terminal, which is connected with a liner arranged further inwardly in cross-section with respect to the first liner, are provided. In addition, the external terminal is connected with ground potential by way of a regulable reference capacitor. A test voltage dropping between internal terminal and external terminal, a setting voltage dropping at a reference capacitor and a phase displacement between the test voltage and the setting voltage are determined. A resultant voltage is calculated by forming the difference between test voltage and setting voltage with consideration of the phase displacement. The reference capacitor is now regulated so that a phase displacement between the resultant voltage and the test voltage or between the resultant voltage and the setting voltage is equal to zero. The settings of the reference capacitor can thus be evaluated as an indication of the state of ageing or the quality of the insulation.

DE 100 37 432 A1 describes a method for monitoring a capacitor bushing acted on by an electrical operating voltage, in which a voltage divider is formed by an electrically conductive liner, wherein at least one measurement value of an electrical measurement variable is detected by a measuring tap, which is connected with the liner, and by ground potential and is stored. After detection of the at least one measurement value, the impedance between the measuring tap and ground potential is changed and at least one signal value of a measurement signal which then forms is detected by the measuring tap and ground potential and is stored, in which case the time interval between the instant of detection of the measurement value and the instant of detection of a signal value is dimensioned so that a change, which might have taken place between the two instants, in the operating voltage is negligible.

SUMMARY

An embodiment of the present invention provides a method that monitors capacitor bushings for an alternating current mains. The alternating current mains has a first phase, second phase, and third phase and includes: a first mains line, with which the first phase and a first capacitor bushing are associated and at which a first mains voltage is present, a second mains line, with which the second phase and a second capacitor bushing are associated and at which a second mains voltage is present, and a third mains line, with which the third phase and a third capacitor bushing are associated and at which a third mains voltage is present. Each of the first capacitor bushing, the second capacitor bushing, and the third capacitor bushing includes: a conductor connected with the associated one of the first mains line, the second mains line, or the third mains line; and an electrically conductive foil surrounding the conductor. The method includes: at a predetermined first instant, for each of the first phase, the second phase, and the third phase: a corresponding first reference voltage phasor is determined for a first reference voltage; and a foil voltage present between the respective foil and ground potential is detected and a corresponding first foil voltage phasor is determined; at a predetermined second instant lying after the first instant, for each of the first phase, the second phase, and the third phase: a corresponding second reference voltage phasor is determined for a second reference voltage; the foil voltage is detected and a corresponding second foil voltage phasor is determined; for each of the first capacitor bushing, the second capacitor bushing, and the third capacitor bushing: a loss factor change is calculated in dependence on the respective first reference voltage phasor and the second reference voltage phasor and the first foil voltage phasor and the second foil voltage phasor of the respective one of the first capacitor bushing, the second capacitor bushing, and the third capacitor bushing as well as in dependence on the first reference voltage phasor and the second reference voltage phasor and the first foil voltage phasor and the second foil voltage phasor of a respectively adjacent capacitive bushing which is one of the first capacitor bushing, the second capacitor bushing, and the third capacitor bushing; the loss factor change is compared with a tolerance value; and a monitoring signal is generated in dependence on the results of the loss factor comparisons.

BREIF DESCRIPTION OF THE DRAWINGS

The present invention will be described in even greater detail below based on the exemplary figures. The invention is not limited to the exemplary embodiments. All features described and/or illustrated herein can be used alone or combined in different combinations in embodiments of the invention. The features and advantages of various embodiments of the present invention will become apparent by reading the following detailed description with reference to the attached drawings which illustrate the following:

DETAILED DESCRIPTION

Figure 1:
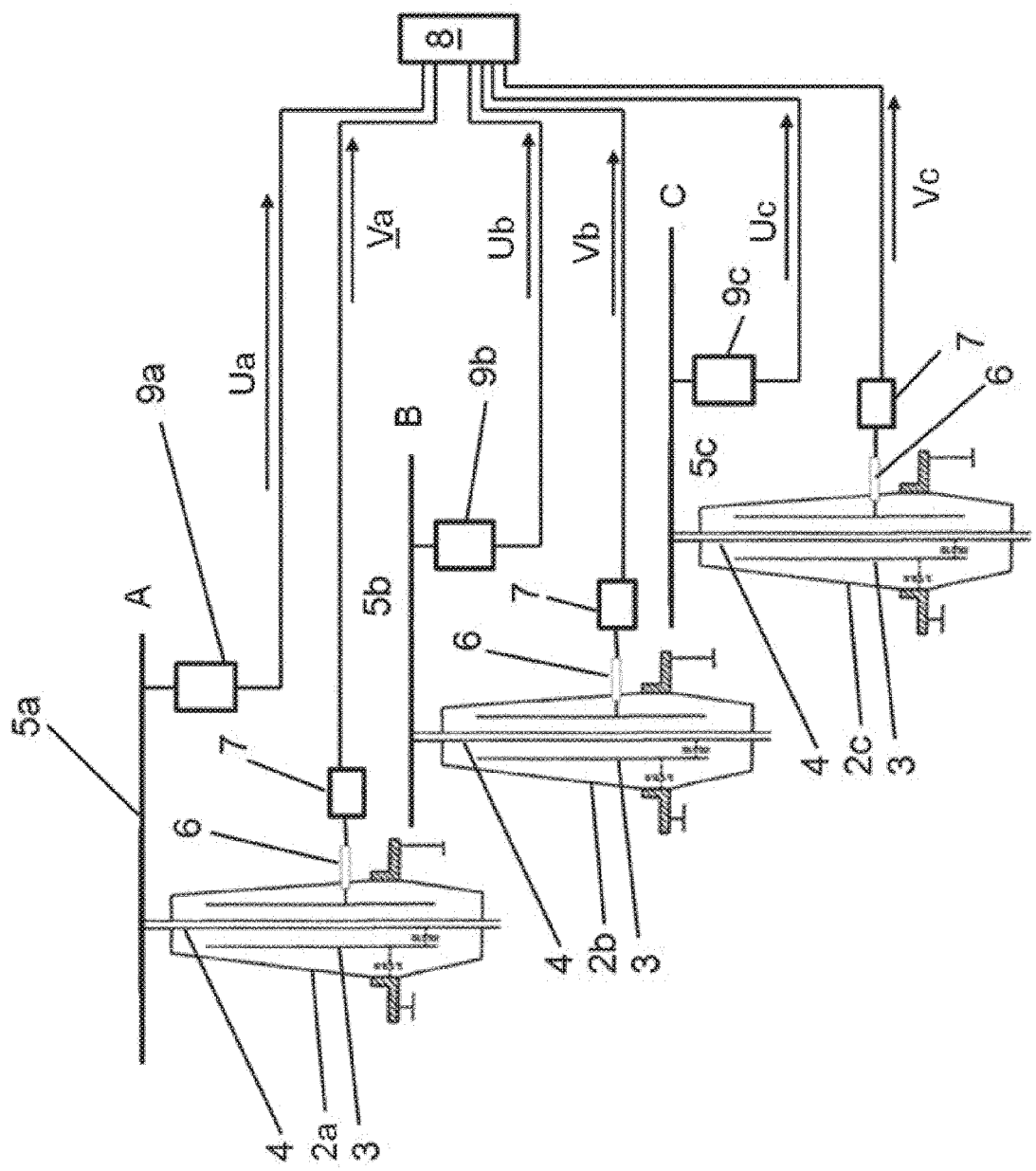
FIG. 1 shows a form of embodiment of a device for monitoring capacitor bushings for a three-phase alternating current mains.

The present invention enables better monitoring of capacitor bushings.

According to a first aspect, the present invention provides a method of monitoring capacitor bushings for an alternating current mains, where the alternating current mains has a first, second and third phase. Further, the alternating current mains includes a first mains line, with which the first phase and a first capacitor bushing are associated and to which a first mains voltage is applied, a second mains line, with which the second phase and a second capacitor bushing are associated and to which a second mains voltage is applied, and a third mains line, with which the third phase and a third capacitor bushing are associated and to which a third mains voltage is applied. Each of these capacitor bushings includes a conductor connected with the associated mains line and an electrically conductive foil surrounding this conductor.

In the context of a method of an embodiment of the present invention:

at a predetermined first instant, for each of these phases:
- a corresponding first reference voltage phasor or complex reference voltage value is determined for a first reference voltage;
- a foil voltage present between the respective foil and ground potential is detected and a corresponding first foil voltage phasor or complex foil voltage value is determined;

at a predetermined second instant lying after the first instant, for each of these phases:
- a corresponding second reference voltage phasor or complex reference voltage value is determined for a second reference voltage;
- the foil voltage is detected and a corresponding second foil voltage phasor or complex foil voltage value is determined;

for each of these capacitor bushings;
- a loss factor change is calculated in dependence on the respective first and second reference voltage phasors and foil voltage phasors as well as on the first and second reference voltage phasors and foil voltage phasors of the respectively adjacent capacitive bushing (2b, 2c, 2a);
- the loss factor change is compared with a tolerance value;

a monitoring signal is generated in dependence on the results of these loss factor comparisons.

The method according to an embodiment uses the characteristic and measurement variables of adjacent capacitor bushings of the same power transformer for the actual monitoring. In that regard, compensation is provided for external influences—such as, for example, temperature changes—on the loss factor changes of the capacitor bushing. In addition, during monitoring of a capacitor bushing, which is obviously connected with the mains line associated therewith, transfer to the measurement voltage of fluctuations in the mains voltage, which is present at a mains line, by way of the capacitor bushing connected with the respective mains line is avoided. Thus, at least partial compensation for measurement tolerances in the detection of the foil voltages can be provided and a better statement about the state of the capacitor bushing can be made.

The loss factor for each capacitor bushing can be derived in any mode and manner according to requirements, for example as a ratio of the real part, which is liable to loss, to the notional part, which is free of loss, of a complex phasor magnitude and/or the tangent of the loss angle δ between the complex magnitude and its notional part. In that case, the loss factors for capacitor bushings in the high-voltage region usually lie in the range between 0.005% and 1%.

Each capacitor bushing can be constructed in any mode and manner according to requirements and, for example, have an upper capacitance and a lower capacitance. The upper capacitance can be formed as, for example, the capacitance of a capacitor formed by the respective foil and the respective conductor. Usual values for upper capacitances lie in the range between 200 and 600 pF.

The lower capacitance can be formed as, for example, the capacitance of a parallel circuit including a measuring device, by which, for example, a foil voltage can be detected and/or measured, and a capacitor. The capacitor is in that case formed by the respective outermost foil and ground potential or by the respective outermost foil and an electrically conductive flange, which is secured to the outer surface of the respective capacitor bushing and lies at ground potential. The lower capacitances usually lie between 1 and 5 µF, but they can also have other values according to requirements and, for example, lie between 01 µF and 50 µF or between 0.2 µF and 20 µF or between 0.5 µF and 10 µF.

Designated as mains voltage in the following is the voltage lying between a phase of the alternating current mains and ground potential. The measurement of the mains voltage and formation of the mains voltage phasors can be carried out in any mode and manner, for example by means of capacitive voltage dividers.

Designated as foil voltage in the following is the voltage which is detected at the lower capacitance by means of a measuring device and which lies between the outermost foil of the capacitor bushing and ground potential. Determination of the foil voltage phasor or complex foil voltage value is carried by means of known methods of electrotechnology.

In the case of a three-phase alternating current mains, the term "adjacent" is defined with respect to a predetermined rotational sense of the corresponding phasor system, for example in such a way the second phase B is adjacent to the first phase A, the third phase C is adjacent to the second phase B and the first phase A is adjacent to the third phase C.

The tolerance value can be formed in any mode and manner according to requirements and, for example, can represent a percentage proportion of an appropriate characteristic variable from the specification of a capacitor bushing or can be derived on the basis of empirical values. The tolerance values can be selected, in accordance with requirements, to be uniform for all capacitor bushings or individually different for each capacitor bushing.

The monitoring signal can be formed in any mode and manner according to requirements, for example as an acoustical and/or optical and/or electrical signal.

It can be provided that each reference voltage is the respective mains voltage.

It can be provided that:
a first parallel capacitor bushing is associated with the first mains line;
a second parallel capacitor bushing is associated with the second mains line;
a third parallel capacitor bushing is associated with the third mains line;
each of these parallel capacitor bushings in that case includes a conductor connected with the associated mains line and an electrically conductive foil surrounding this conductor;
for each of these phases the first and second reference voltages are first and second foil voltages respectively present at the first instant and the second instant between the foil and ground potential of the respective parallel capacitor bushing.

These parallel capacitor bushings are, for example, present in order to connect, additionally to first electrical apparatus connected by way of the three capacitor bushings to the three phases, a second electrical apparatus—here also designated parallel apparatus—to the three phases yin parallel to the first apparatus. Since the parallel first voltage values form the initial reference voltage values it is possible to dispense with detection of the mains voltages. This has the consequence, without negatively influencing the accuracy of the monitoring method, of cost savings as well as simplified maintenance and servicing, since fewer measuring instruments have to be used.

It can be provided that for each of these phases the reference voltage is a constant voltage for which a corresponding constant voltage phasor is predetermined.

It can be provided that the magnitude of each constant voltage phasor is equal to a rated voltage value of the alternating current mains and for the first phase the phase angle of the first and second constant voltage phasors is 0°, for the second phase the phase angle of the first and second constant voltage phasors is 120° and for the third phase the phase angle of the first and second constant voltage phasors is 240°.

It can be provided that the loss factor change of the first capacitor bushing is calculated in accordance with the following equation:

$$\Delta D_a(t_2) = \theta_{ab}(t_2) - \theta_{ab}(t_1)$$

wherein $$\theta_{ab}(t_j) = \left( \arccos \frac{\underline{V}_a(t_j) \cdot \underline{V}_b(t_j)}{|\underline{V}_a(t_j)| \cdot |\underline{V}_b(t_j)|} - \arccos \frac{\underline{R}_a(t_j) \cdot \underline{R}_b(t_j)}{|\underline{R}_a(t_j)| \cdot |\underline{R}_b(t_j)|} \right),$$

$$j = 1, 2$$

and/or
the loss factor change of the second capacitor bushing is calculated in accordance with the following equation $$\Delta D_b(t_2) = \theta_{bc}(t_2) - \theta_{bc}(t_1)$$

wherein $$\theta_{bc}(t_j) = \left( \arccos \frac{\underline{V}_b(t_j) \cdot \underline{V}_c(t_j)}{|\underline{V}_b(t_j)| \cdot |\underline{V}_c(t_j)|} - \arccos \frac{\underline{R}_b(t_j) \cdot \underline{R}_c(t_j)}{|\underline{R}_b(t_j)| \cdot |\underline{R}_c(t_j)|} \right),$$

$$j = 1, 2$$

and/or
the loss factor change of the third capacitor bushing is calculated in accordance with the following equation $$\Delta D_c(t_2) = \theta_{ca}(t_2) - \theta_{ca}(t_1)$$

wherein $$\theta_{ca}(t_j) = \left( \arccos \frac{\underline{V}_c(t_j) \cdot \underline{V}_a(t_j)}{|\underline{V}_c(t_j)| \cdot |\underline{V}_a(t_j)|} - \arccos \frac{\underline{R}_c(t_j) \cdot \underline{R}_a(t_j)}{|\underline{R}_c(t_j)| \cdot |\underline{R}_a(t_j)|} \right),$$

$$j = 1, 2;$$

wherein $\underline{R}a(t1)$, $\underline{R}b(t1)$, $\underline{R}c(t1)$ are the first reference voltage phasors of the first, second and third phases;
$\underline{V}a(t1)$, $\underline{V}b(t1)$, $\underline{V}c(t1)$ are the first foil voltage phasors of the first, second and third phases;
$\underline{R}a(t2)$, $\underline{R}b(t2)$, $\underline{R}c(t2)$ are the second reference voltage phasors of the first, second and third phases;
$\underline{V}a(t2)$, $\underline{V}b(t2)$, $\underline{V}c(t2)$ are the second foil voltage phasors of the first, second and third phases.

It can be provided that tolerance values DA>0, DB>0, DC>0 are determined for the loss factor comparisons and if the loss factor comparisons have the result that $$|\Delta D_a(t_2)| \leq D_A \text{ and } |\Delta D_b(t_2)| \leq D_B \text{ and } |\Delta D_c(t_2)| \leq D_C$$

then a monitoring signal is generated which indicates that the capacitor bushings are in a state of proper order and otherwise a monitoring signal is generated which indicates that at least one capacitor bushing is not in a state of proper order.

It can be provided that tolerance values DA>0, DB>0, DC>0 are determined for the loss factor comparisons and if the loss factor comparisons have the result that $$|\Delta D_a(t_2)| > D_A \text{ and } |\Delta D_b(t_2)| > D_B \text{ and } |\Delta D_c(t_2)| \leq D_C$$

then a monitoring signal is generated which indicates that either the second capacitor bushing is not in a state of proper order or the two other capacitor bushings are not in a state of proper order and have a fault of the same kind;
if the loss factor comparisons have the result that $$|\Delta D_a(t_2)| \leq D_A \text{ and } |\Delta D_b(t_2)| > D_B \text{ and } |\Delta D_c(t_2)| > D_C$$

then a monitoring signal is generated which indicates that either the third capacitor bushing is not in a state of proper order or the two other capacitor bushings are not in a state of proper order and have a fault of the same kind;
if the loss factor comparisons have the result that $$|\Delta D_a(t_2)| > D_A \text{ and } |\Delta D_b(t_2)| \leq D_B \text{ and } |\Delta D_c(t_2)| > D_C$$

then a monitoring signal is generated which indicates that either the first capacitor bushing is not in a state of proper order or the two other capacitor bushings are not in a state of proper order and have a fault of the same kind.

Each of these tolerance values DA, DB, DC can be determined in any mode and manner according to requirements and can be set to, for example, a value of 0.0001 or 0.0002 or 0.0005 or 0.001 or 0.002 or 0.005 or 0.01 or 0.02 or 0.05. Each of these tolerance values and at least one of the other tolerance values can be same or different.

It can be provided that otherwise a monitoring signal is generated which indicates that either all three capacitor bushings are not in a state of proper order or two capacitor bushings are not in a state of proper order and do not have a fault of the same kind.

It can be provided that each tolerance value antitonically depends on the age of the respective capacitor bushing.

It can further be provided that at a predetermined third instant lying after the second instant, for each of these phases:
- a corresponding third reference voltage phasor or complex reference voltage value is determined for a reference voltage;
- the foil voltage is detected and a corresponding third foil voltage phasor or complex foil voltage value is determined;
- the second reference voltage phasor is replaced by the third reference voltage phasor and the second foil voltage phasor is replaced by the third foil voltage phasor;

for each of these capacitor bushings:
- the calculation and comparison of the loss factor change are repeated;

a monitoring signal is generated in dependence on the results of these loss factor comparisons.

It can further be provided that before each replacement of the second reference voltage phasor and foil voltage phasor the first reference voltage phasor is replaced by the second reference voltage phasor and the first foil voltage phasor is replaced by the second foil voltage phasor.

It can be further provided that at least one predetermined later instant lying after the second instant, for each of these phases:
- a corresponding later reference voltage phasor or complex mains voltage value is determined for a reference voltage;
- the foil voltage is detected and a corresponding later foil voltage phasor or more complex foil voltage value is determined;
- for each of these capacitor bushings the calculation of the loss factor change additionally depends on the respective later mains voltage phasors and foil voltage phasors.

It can be further provided that at at least one predetermined later instant lying after the second instant, for each of these phases:
- a corresponding later reference voltage phasor or complex reference voltage value is determined for a reference voltage;
- the foil voltage is detected and a corresponding later foil voltage phasor or complex foil voltage value is determined;

for each of these capacitor bushings:
- a loss factor change is calculated in dependence on the respective first, second and later reference voltage phasors and foil voltage phasors as well as on the first, second and later reference voltage phasors and foil voltage phasors of the respectively adjacent capacitor bushing;
- the loss factor change is compared with a tolerance value;

a monitoring signal is generated in dependence on the results of these loss factor comparisons.

It can further be provided that the loss factor change of the first capacitor bushing is calculated in accordance with the following equation:

$$\Delta D_a(t_n) = \sum_{i=2}^{n} \{g_{ai}[\theta_{ab}(t_i) - \theta_{ab}(t_{i-1})]\}$$

wherein $$\theta_{ab}(t_j) = \arccos\frac{\underline{V}_a(t_j) \cdot \underline{V}_b(t_j)}{|\underline{V}_a(t_j)| \cdot |\underline{V}_b(t_j)|} - \arccos\frac{\underline{R}_a(t_j) \cdot \underline{R}_b(t_j)}{|\underline{R}_a(t_j)| \cdot |\underline{R}_b(t_j)|},$$

$$j = 1, \ldots, n$$

$$\sum_{i=2}^{n} g_{ai} = 1$$

and/or
the loss factor change of the second capacitor bushing is calculated in accordance with the following equation:

$$\Delta D_b(t_n) = \sum_{i=2}^{n} \{g_{bi}[\theta_{bc}(t_i) - \theta_{bc}(t_{i-1})]\}$$

wherein $$\theta_{bc}(t_j) = \arccos\frac{\underline{V}_b(t_j) \cdot \underline{V}_c(t_j)}{|\underline{V}_b(t_j)| \cdot |\underline{V}_c(t_j)|} - \arccos\frac{\underline{R}_b(t_j) \cdot \underline{R}_c(t_j)}{|\underline{R}_b(t_j)| \cdot |\underline{R}_c(t_j)|},$$

$$j = 1, \ldots, n$$

$$\sum_{i=2}^{n} g_{bi} = 1$$

and/or
the loss factor change of the third capacitor bushing is calculated in accordance with the following equation:

$$\Delta D_c(t_n) = \sum_{i=2}^{n} \{g_{ci}[\theta_{ca}(t_i) - \theta_{ca}(t_{i-1})]\}$$

wherein $$\theta_{ca}(t_j) = \arccos\frac{\underline{V}_c(t_j) \cdot \underline{V}_a(t_j)}{|\underline{V}_c(t_j)| \cdot |\underline{V}_a(t_j)|} - \arccos\frac{\underline{R}_c(t_j) \cdot \underline{R}_a(t_j)}{|\underline{R}_c(t_j)| \cdot |\underline{R}_a, (t_j)|},$$

$$j = 1, \ldots, n$$

$$\sum_{i=2}^{n} g_{ci} = 1;$$

n>2 is the number of the instants;
t1, t2 are the first and second instants and t3, ..., to are the later instants;
gai, gbi, gci are ith weighting factors for the first, second and third capacitor bushings.

It can be further provided that each weighting factor antitonically depends on the age of the respective instant; and/or
there applies for the weighting factors:

$$g_{ai-1} \leq g_{ai} \text{ and/or } g_{bi-1} \leq g_{bi} \text{ and/or } g_{ci-1} \leq g_{ci} \text{ for } i=2, \ldots, n.$$

It can be further provided that:
between determination of the first reference voltage phasors and determination of the first foil voltage phasors:
- the magnitudes of the first reference voltage phasors are compared with one another,
- determination of the first foil voltage phasors is carried out if these magnitude comparisons have the result that these magnitudes do not differ from one another by more than a predetermined amount; and/or between determination of the second reference voltage phasors and determination of the second foil voltage phasors:
the magnitudes of the second reference voltage phasors are compared with one another,
determination of the second foil voltage phasors is carried out if these magnitude comparisons have the result that these magnitudes do not differ from one another by more than a predetermined amount.

This comparison of the magnitudes of the reference voltage phasors makes it possible to determine an instant at which the actual monitoring, i.e. comparison of the loss factor changes of the capacitor bushings and generation of the monitoring signal, is particularly advantageous or favourable, since it then is not hampered, obstructed or even made impossible by reference voltages differing from one another by in excess of the predetermined amount. It is thus achieved that independently of fluctuations in the voltages in the alternating current mains and measuring tolerances in the detection of the foil voltages, a better statement about the state of the capacitor bushings can be undertaken.

Through consideration of the reference voltages it is possible, for example, to detect changes over time of the voltage relationships, also termed asymmetries, and thus to provide at least partial compensation for corresponding differences of the foil voltages tapped at the capacitor bushings. Reliable monitoring of the capacitor bushings with consideration and evaluation of the differences and disturbances of the voltages in the alternating current mains is thus guaranteed.

For comparison of the magnitudes of the reference voltage phasors it is possible to use, depending on the respective requirements, amounts and/or effective values and/or peak values and/or amplitudes of the reference voltage phasors.

It can further be provided that:
each magnitude comparison is carried out in such a way that
tolerance values RAB>0, RBC>0, RCA>0 are determined as the respective measurement;
it is checked whether:

$|R_{ae}-R_{be}| \leq R_{AB}$ and $|R_{be}-R_{ce}| \leq R_{BC}$ and $|R_{ce}-R_{ae}| \leq R_{CA}$;

Rae is the amount or the effective value of the respective reference voltage phasor of the first phase;
Rbe is the amount or the effective value of the respective reference voltage phasor of the second phase;
Rce is the amount or the effective value of the respective reference voltage phasor of the third phase.

Each of these tolerance values RAB, RBC, RCA can be determined in any mode and manner according to requirements and, for example, be set to a value corresponding with 0.1% or 0.2% or 0.5% or 1% or 2% or 3% or 4% or 5% or 7% or 10% or 15% or 20% or 25% or 30% or 40% or 50% of the rated value of the respective reference voltage Rae, Rbe, Rce. Each of these tolerance values and at least one of the other tolerance values can be the same or different.

It can be further provided that:
between determination of the first reference voltage phasors and determination of the first foil voltage phasors:
the phase angles of the first reference voltage phasors are compared with one another,
determination of the first foil voltage phasors is carried out if these angle comparisons have the result that these phase angles do not differ from one another by more than a predetermined amount;

between determination of the second reference voltage phasors and determination of the second foil voltage phasors:
the phase angles of the second reference voltage phasors are compared with one another,
determination of the second foil voltage phasors is carried out if these angle comparisons have the result that these phase angles do not differ from one another by more than a predetermined amount.

This comparison of the magnitudes of the phase angles of the reference voltage phasors makes it possible to determine an instant at which the actual monitoring, i.e. the comparison of the loss factor changes of the capacitor bushings and generation of the monitoring signal, is particularly advantageous or favourable, since it then is not hampered, obstructed or even made impossible by phase positions differing from one another by in excess of the predetermined amount. It is thus achieved that independently of fluctuations in the phase position of the voltages of the alternating current mains and measuring tolerances in the detection of the foil voltages, a better statement about the state of the capacitor bushings can be undertaken.

It can be further provided that:
each angle comparison is carried out in such a way that
tolerance values PAB>0, PBC>0, PCA>0 are determined as the respective measurement;
it is checked whether:

$|\varphi_a-\varphi_b| \leq P_{AB}$ and $|\varphi_b-\varphi_c| \leq P_{BC}$ and $|\varphi_c-\varphi_a| \leq P_{CA}$;

φa is the phase angle of the respective reference voltage phasor of the first phase;
φb is the phase angle of the respective reference voltage phasor of the second phase;
φc is the phase angle of the respective reference voltage phasor of the third phase.

Each of these tolerance values PAB, PBC, PCA can be determined in any mode and manner according to requirements and can, for example, be set to a value corresponding with 0.1% or 0.2% or 0.5% or 1% or 2% or 3% or 4% or 5% or 7% or 10% or 15% or 20% of the standard value of the respective phase offset. Each of these tolerance values and at least one of the other tolerance values can be the same or different.

It can further be provided that each foil voltage phasor is determined by the respective foil voltage being detected at least twice and these detected foil voltages being averaged and/or filtered.

It can further be provided that for the averaging a sliding mean value is formed; and/or for the averaging a weighted mean value is formed, wherein, in particular, for each measurement value there is determined a weighting factor antitonically depending on the age of this measurement value.

According to a second aspect the invention proposes a device for monitoring capacitor bushings for an alternating current mains, wherein the alternating current mains has a first, second and third phase and includes a first mains line, with which the first phase and a first capacitor bushing are associated and to which a first mains voltage is applied, a second mains line, with which the second phase and a second capacitor bushing are associated and to which a second mains voltage is applied, as well as a third mains line, with which the third phase and a third capacitor bushing are associated and to which a third mains voltage is applied. Each of these capacitor bushings includes a conductor connected with the associated mains line, and an electrically conductive foil surrounding this conductor.

The device includes:
- a first voltage converter which can be connected with the first mains line;
- a second voltage converter which can be connected with the second mains line;
- a third voltage converter which can be connected with the third mains line;
- a first measuring adapter which can be connected with the foil of the first capacitor bushing;
- a second measuring adapter which can be connected with the foil of the second capacitor bushing;
- a third measuring adapter which can be connected with the foil of the third capacitor bushing;
- a measuring device coupled to the measuring adapters;
- an evaluating device coupled to the voltage converters and the measuring device.

Each of these voltage converters for the respective phase can detect the mains voltage;

the measuring device for each of these phases can detect, with the help of the respective measuring adapter, a foil voltage present between the respective foil and ground potential;

the evaluating device is so constructed that at a predetermined first instant, for each of these phases it:
- can detect the mains voltage with the help of the respective voltage converter and can determine a corresponding first mains voltage phasor;
- can detect the foil voltage with the help of the measuring device and can determine a corresponding first foil voltage phasor;

the evaluating device is so constructed that at a predetermined second instant lying after the first instant, for each of these phases it
- can detect the mains voltage with the help of the respective voltage converter and can determine a corresponding second mains voltage phasor;
- can detect the foil voltage with the help of the measuring device and can determine a corresponding second foil voltage phasor;

the evaluating device is so constructed that for each of these capacitor bushings it
- can calculate a loss factor change in dependence on the respective first and second mains voltage phasors and foil voltage phasors as well as on the first and second mains voltage phasors and foil voltage phasors of the respectively adjacent capacitor bushing;
- can compare the loss factor change with a tolerance value;

the evaluating device is so constructed that it can generate a monitoring signal in dependence on the results of these loss factor comparisons.

It can further be provided that each of these voltage converters is constructed as a capacitive voltage converter or inductive voltage converter or resistive voltage converter.

It can further be provided that the measuring device includes at least one measuring capacitor or measuring shunt.

The descriptions and explanations with respect to any one of the aspects of the invention, particularly to individual features of that aspect, also correspondingly apply in analogous manner to the other aspects of the invention.

Forms of embodiment of the invention are explained in more detail in the following by way of example on the basis of the accompanying drawings. The individual features evident therefrom are not, however, restricted to the individual forms of embodiment, but can be connected and/or combined with further above-described individual features and/or with individual features of other forms of embodiment. The details in the drawings are to be understood as merely explanatory, but not limiting. The reference numerals present in the claims are not to restrict the scope of protection of the invention in any way, but refer merely to the forms of embodiment shown in the drawings.

The following observations described in the explanations with respect to FIG. 1 to FIG. 4 relate to a form of embodiment in which the respective reference voltage phasors $\underline{R}a(tj)$, $\underline{R}b(tj)$, $\underline{R}c(tj)$ are determined on the basis of the respective mains voltages $Ua(tj)$, $Ub(tj)$, $Uc(tj)$. Thus, in the explanations with respect to FIG. 1 to FIG. 4 the respective mains voltage phasors $\underline{U}a(tj)$, $\underline{U}b(tj)$, $\underline{U}c(tj)$ are used as reference voltage phasors.

Moreover, it is assumed that due to sufficiently small angles the small angle approximation can be assumed for the following explanations for calculation of the loss factor change.

A form of embodiment of a device 1 for monitoring capacitor bushings 2a, 2b, 2c for a three-phase alternating current mains is schematically illustrated in FIG. 1. In this form of embodiment the capacitor bushings 2a, 2b, 2c belong to a transformer (not illustrated here) which, by way of example, is here a high-voltage transformer. Capacitor bushings 2a, 2b 2c of that kind are used, for example, in the case of high voltages in the range of a few kV up to some 1,000 kV. Here the alternating current mains is, by way of example, a high-voltage mains. Each of the three capacitor bushings 2a, 2b, 2c is associated with one of the three phases A, B, C of the alternating current mains and includes a conductor 4, which is connected with the respective mains line 5a, 5b, 5c of the alternating current mains, and several electrically conductive foils, which surround the conductor 4 in several layers or strata and of which merely the outermost foil 3 is illustrated.

The device 1 includes an evaluating device 8 as well as, for each phase A, B, C, a measuring device 7 and a measuring adapter 6, which is connected with the foil 3 of the capacitor bushing 2a, 2b, 2c belonging to the respective phase. The evaluating device 8 is connected with each measuring device 7 in order to determine the foil voltage phasor $\underline{V}a$, $\underline{V}b$, $\underline{V}c$ for the phases A, B, C and thus forms a common evaluating device 8 for all measuring devices 7.

The foil voltage phasors $\underline{V}a$, $\underline{V}b$, $\underline{V}c$ are here electrical voltage phasors which are respectively determined at a lower-voltage capacitor KU1, KU2, KU3, which is described further below and shown in FIG. 3, of the respective phase A, B, C. In this form of embodiment the device 1 additionally includes, for each phase A, B, C, a voltage converter 9a, 9b, 9c which is connected with the respective mains line 5a, 5b, 5c in order to detect a second electrical measurement variable for the respective phase A, B, C. These second measurement variables are here electrical voltage phasors which are respectively determined between the respective mains line 5a, 5b, 5c and ground potential 13 and here are also termed mains voltage phasors $\underline{U}a$, $\underline{U}b$, $\underline{U}c$. The evaluating device 8 is connected with each voltage converter 9a, 9b, 9c in order to determine the mains voltage phasors $\underline{U}a$, $\underline{U}b$, $\underline{U}c$ and thus forms a common evaluating device 8 for all voltage converters 9a, 9b, 9c.

The possibility is created by the device 1 that the evaluating device 8 takes into consideration, in the monitoring of the capacitor bushings 2a, 2b, 2c, asymmetries and/or fluctuations of the mains voltage phasors $\underline{U}a$, $\underline{U}b$, $\underline{U}c$ on the mains lines 5a, 5b, 5c.

Figure 2:
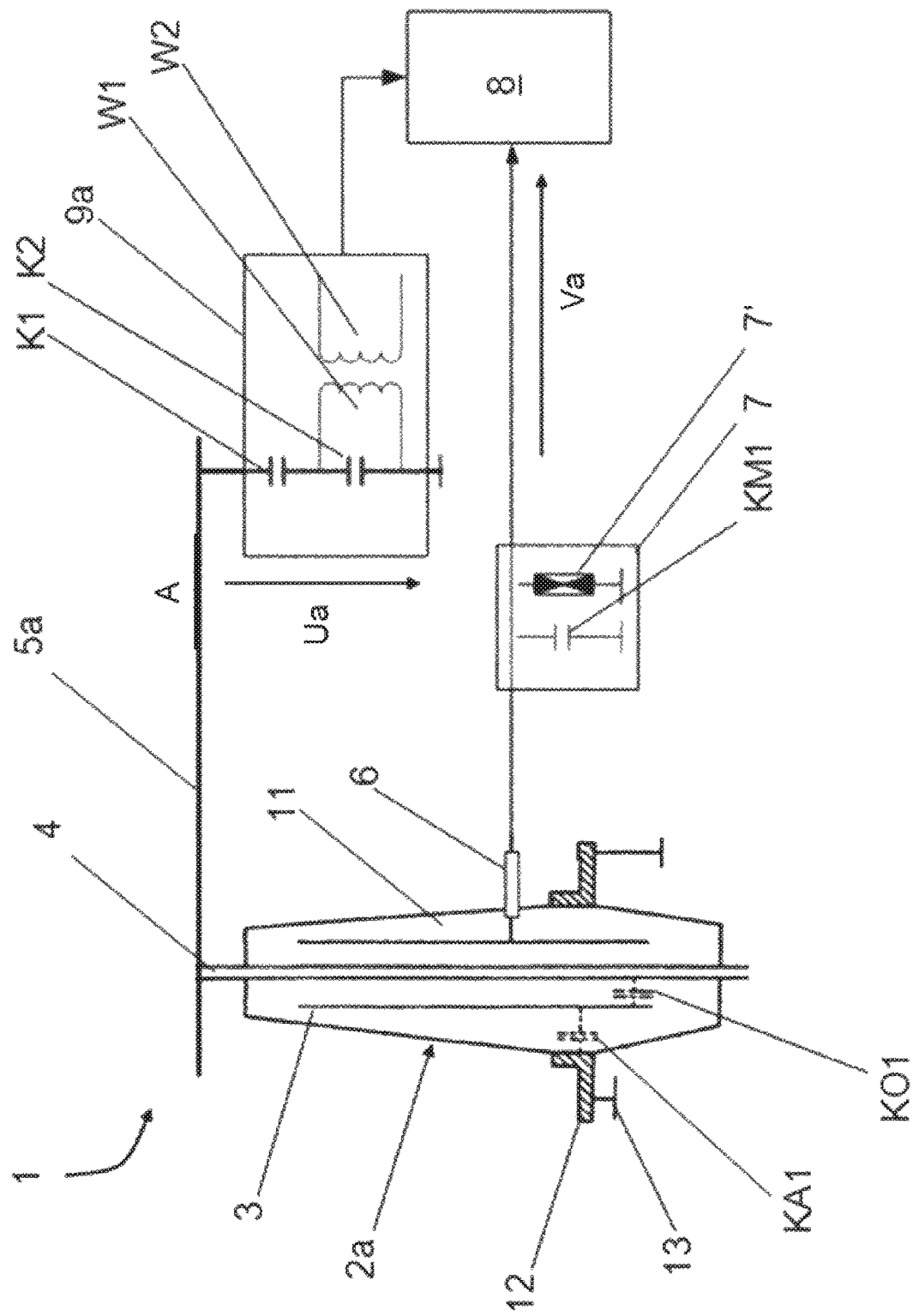
FIG. 2 shows a part of the device of FIG. 1.

A first part of the device 1, which is associated with a first phase A, is illustrated in detail in FIG. 2. A second part of the device 1 associated with a second phase B and a third part of the device 1 associated with a third phase C correspond in analogous manner with this first part, so that the statements and explanations with respect to the first part correspondingly also apply in analogous manner to these two other parts.

The first capacitor bushing 2a associated with the first phase A includes an insulating body 11, through the interior of which the conductor 4 is led. This contacts, at its upper end, the mains line associated with its capacitor bushing 2a and, at its lower end, a winding (not illustrated here) of the high-voltage transformer. Embedded in the insulating body 11 are the electrically conductive foils, which here are indicated only by the outermost foil 3 and, as viewed electrically, form a series circuit of capacitors. This series circuit includes the capacitors, which are respectively formed by two adjacent foils, and a capacitor, which is formed by the innermost foil (not shown here) and the conductor 4. This series circuit of capacitors between the outermost foil 3 and the conductor 4 forms, as equivalent circuit for each capacitive bushing 2a, 2b, 2c, a corresponding upper-voltage capacitor KO1, KO2, KO3.

An electrically conductive flange 12 lying at earth potential or ground potential 13 is arranged at the capacitor bushing 2a. This flange 12 serves for fastening and/or securing the capacitor bushing 2a. The outermost foil 3 forms with the flange 12 and ground potential 13, as equivalent circuit for each capacitor bushing 2a, 2b, 2c, a corresponding outer capacitor KA1, KA2, KA3.

The measuring adapter 6 penetrates through the insulation body 11 and produces an electrically conductive connection with the outermost foil 3. In this form of embodiment, each measuring device 7 includes a measuring capacitor KM1, KM2, KM3, which is connected with ground potential 13. If required, it can additionally include a spark gap (not illustrated), which is connected in parallel with the respective measuring capacitor KM1, KM2, KM3, and/or an overvoltage protector 7', which is connected in parallel with the respective measuring capacitor KM1, KM2, KM3.

The evaluating device 8 is electrically conductively connected with the mains lie 5a by way of the voltage converter 9a. In this form of embodiment the voltage converter 9a is constructed as a capacitive voltage converter and includes a capacitive voltage divider, which includes two capacitors K1, K2 connected in series, and two coils or windings W1, W2, which are connected as a transformer for inductive electrical isolation.

Figure 3:
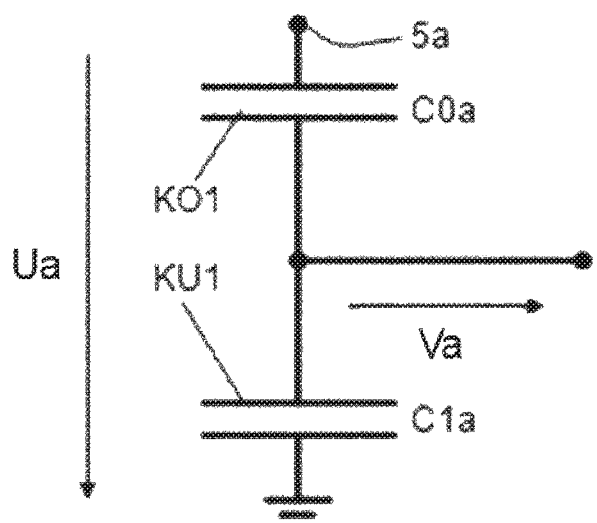
FIG. 3 shows an equivalent circuit consisting of a lower-voltage capacitor and an upper-voltage capacitor.

An equivalent circuit consisting of the respective lower-voltage capacitor KU1 and the respective upper-voltage capacitor KO1 is schematically illustrated in FIG. 3 for the first phase A. A parallel circuit including a respective measuring capacitor KM1 and the outer capacitor KA1 forms the lower-voltage capacitor KU1 with the lower capacitance C1a. This lower capacitance C1a can therefore be readily calculated by the known equation for the series circuit of capacitors from the capacitance CM1 of the measuring capacitor KM1 and the capacitance CA1 of the outer capacitor KA1. If required, the parallel circuit can include, instead of the measuring capacitor KM1, the entire respective measuring device 1 and/or additionally the evaluating device 8, so that then the lower capacitance C1a has to be calculated from the impedance of the measuring device 7, which depends on the capacitance CM1, as well as the capacitance CA1 and the impedance of the evaluating device 8.

The foil voltage V1a is present at the lower-voltage capacitor KU1 and is tapped at the connecting line or the connecting point between the lower-voltage capacitor KU1 and the upper-voltage capacitor KO1 and refers to ground potential 13. The mains voltage Ua drops by way of the series circuit of the upper-voltage capacitor KO1 and the lower-voltage capacitor KU1.

Figure 4:
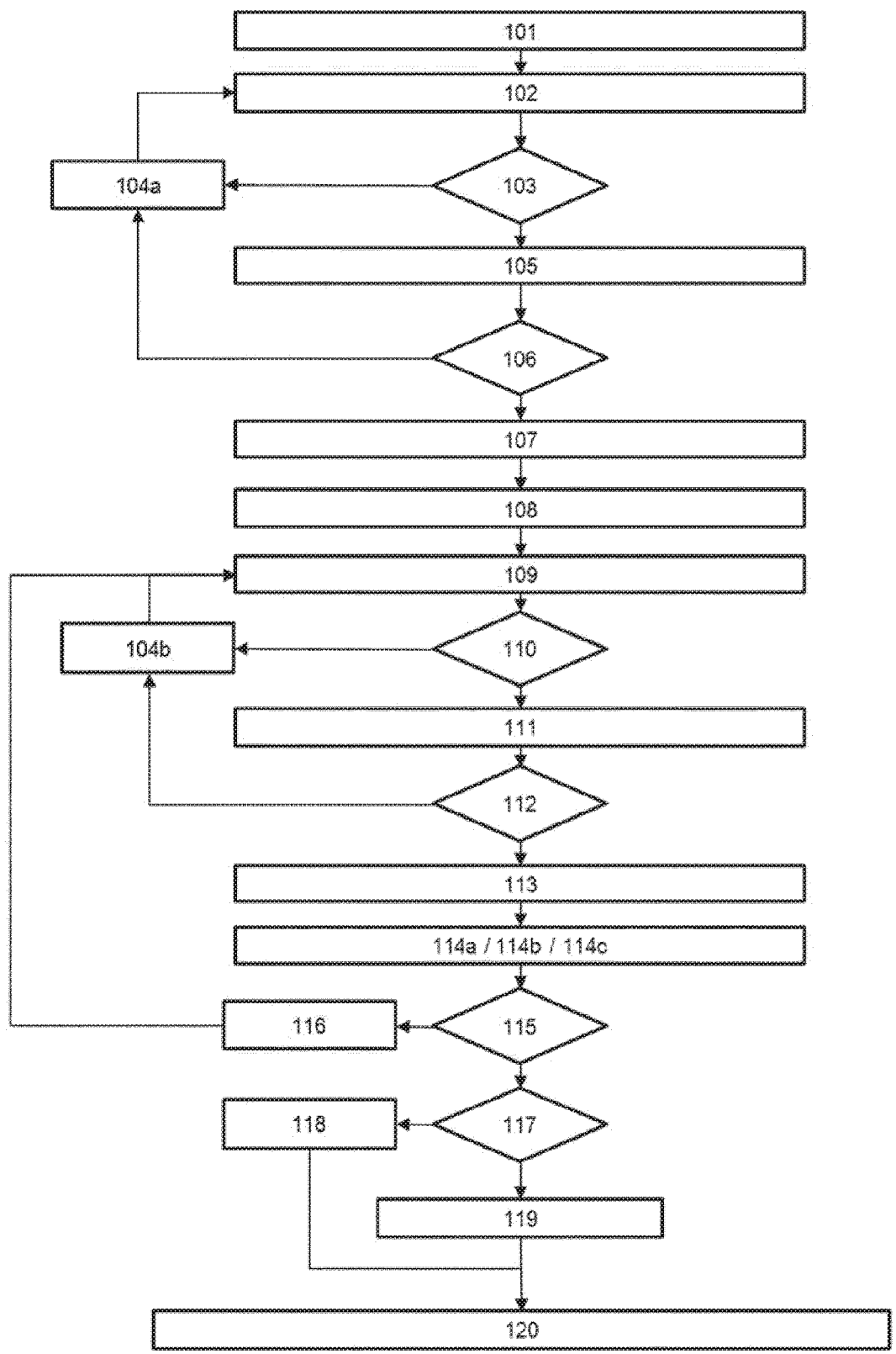
FIG. 4 shows a flow chart of a form of embodiment of a method for monitoring capacitor bushings for a three-phase alternating current mains.

A flow chart of a form of embodiment of a method for monitoring capacitor bushings 2a, 2b, 2c for a three-phase alternating current mains is schematically illustrated in FIG. 4. This method can be performed, for example, by and/or with the help of the device 1 of FIG. 1.

In this form of embodiment the method includes the following steps, which are explained with reference to the device 1 and FIGS. 1 to 3:

Step 101: Start of the method.

Step 102: Detection of first mains voltages Ua(t1), Ub(t1), Uc(t1) as well as the first foil voltages Va(t1), Vb(t1), Vc(t1) for the instant t1 for each of the phases A, B, C.

Step 103: Determination of first mains voltage phasors $\underline{U}a(t1)$, $\underline{U}b(t1)$, $\underline{U}c(t1)$ on the basis of the detected mains voltages Ua(t1), Ub(t1), Uc(t1) and comparison of the mains voltage phasors $\underline{U}a(t1)$, $\underline{U}b(t1)$, $\underline{U}c(t1)$ with one another at the instant t1.

In this form of embodiment, use is made of the effective values of the mains voltages Uae, Ube, Uce for the comparison of the mains voltage phasors $\underline{U}a(t1)$, $\underline{U}b(t1)$, $\underline{U}c(t1)$. In addition, the amounts and/or peak values and/or amplitudes of the mains voltage phasors can also be used for the comparison.

Further, it is provided that the tolerance values RAB>0, RBC>0, RCA>0 are determined for the comparison and the comparison is carried out in such a way that it is checked whether |Uae−Ube|≤RAB and |Ube−Uce|≤RBC and |Uce−Uae|≤RCA.

If so, this means that the comparison of the mains voltage phasors $\underline{U}a(t1)$, $\underline{U}b(t1)$, $\underline{U}c(t1)$ with one another has the result that the mains voltage phasors no longer differ from one another by more than a predetermined amount RAB, RBC, RCA. In this case, the Step 105 is executed.

If not, this then means that the comparison of the first mains voltage phasors $\underline{U}a(t1)$, $\underline{U}b(t1)$, $\underline{U}c(t1)$ with one another has the result that the first mains voltage phasors differ from one another by more than a predetermined amount RAB, RBC, RCA. In this case the Step 104 is executed.

Step 104: A warning signal is generated, which indicates a short-circuit in the power mains and/or a too-strong or excessive asymmetry of the mains voltages Ua, Ub, Uc. Subsequently there is a jump to Step 102.

Step 105: Determination of the phase angle φa, φb, φc of the first mains voltage phasors $\underline{U}a(t1)$, $\underline{U}b(t1)$, $\underline{U}c(t1)$ at the instant t1, wherein φa is the phase angle of the mains voltage phasor $\underline{U}a(t1)$, φb is the phase angle of the mains voltage phasor $\underline{U}b(t1)$ and φc is the phase angle of the mains voltage phasor $\underline{U}c(t1)$.

Step 106: Comparison of the phase angles φa, φb, φc of the first mains voltage phasors $\underline{U}a(t1)$, $\underline{U}b(t1)$, $\underline{U}c(t1)$ with one another. For the comparison of the phase angles of the first voltage phasors with one another it is provided that tolerance values PAB>0, PBC>0, PCA>0 are determined as a measure for the angle comparison. The magnitude comparison can be then carried out in such a way that it is checked whether |φa−φb|≤PAB and |φb−c|≤PBC and |φc−φa|≤PCA.

If so, this means that the phase angle comparison has the result that the phase angles of the first mains voltage phasors φa, φb, φc no longer differ from one another by more than a predetermined amount PAB, PBC, PCA. In this case the Step 107 is executed.

If not, this means that the phase angle comparison has the result that the phase angles of the first mains voltage phasors φa, φb, φc differ from one another by more than a predetermined amount PAB, PBC, PCA. In this case, the jump to Step 104a takes place.

Step 107: Determination of first foil voltage phasors $\underline{V}a(t1)$, $\underline{V}b(t1)$, $\underline{V}c(t1)$ for the instant t1 on the basis of the foil voltages Va(t1), Vb(t1), Vc(t1) which are measured in Step 102 and which are present between the respective foil 3 and ground potential 13 at the instant t1.

Step 108: Determination and archiving of the phase offset φab, φbc, φac between the foil voltage phasors $\underline{V}a(t1)$, $\underline{V}b(t1)$, $\underline{V}c(t1)$ at the predetermined instant t1 in accordance with the following equations:

$$\theta_{ab}(t_j) = \left(\arccos\frac{\underline{V}_a(t_j)\cdot\underline{V}_b(t_j)}{|\underline{V}_a(t_j)|\cdot|\underline{V}_b(t_j)|} - \arccos\frac{\underline{U}_a(t_j)\cdot\underline{U}_b(t_j)}{|\underline{U}_a(t_j)|\cdot|\underline{U}_b(t_j)|}\right),$$
$$j = 1$$

$$\theta_{bc}(t_j) = \left(\arccos\frac{\underline{V}_b(t_j)\cdot\underline{V}_c(t_j)}{|\underline{V}_b(t_j)|\cdot|\underline{V}_c(t_j)|} - \arccos\frac{\underline{U}_b(t_j)\cdot\underline{U}_c(t_j)}{|\underline{U}_b(t_j)|\cdot|\underline{U}_c(t_j)|}\right),$$
$$j = 1$$

$$\theta_{ca}(t_j) = \left(\arccos\frac{\underline{V}_c(t_j)\cdot\underline{V}_a(t_j)}{|\underline{V}_c(t_j)|\cdot|\underline{V}_a(t_j)|} - \arccos\frac{\underline{U}_c(t_j)\cdot\underline{U}_a(t_j)}{|\underline{U}_c(t_j)|\cdot|\underline{U}_a(t_j)|}\right),$$
$$j = 1$$

wherein
$\underline{U}a(tj)$, $\underline{U}b(tj)$, $\underline{U}c(tj)$ are the first mains voltage phasors of the first, second and third phases at the instant j;
$\underline{V}a(tj)$, $\underline{V}b(tj)$, $\underline{V}c(tj)$ are the first foil voltage phasors of the first, second and third phases at the instant j.

Step 109: Detection of second mains voltages Ua(t2), Ub(t2), Uc(t2) and of second foil voltages Va(t2), Vb(t2), Vc(t2) and determination of second mains voltage phasors $\underline{U}a(t2)$, $\underline{U}b(t2)$, $\underline{U}c(t2)$ for an instant t2, which lies after the instant t1, on the basis of the mains voltages Ua(t2), Ub(t2), Uc(t2), which are detected at the instant t2, for each of the phases A, B, C.

Step 110: Comparison of the mains voltage phasors $\underline{U}a(t2)$, $\underline{U}b(t2)$, $\underline{U}c(t2)$ with one another at the instant t2.

The comparison of the mains voltage phasors at the instant t2 is carried out analogously to the comparison of the first mains voltage phasors at the instant t1 of Step 103. If the mains voltage phasors $\underline{U}a(t2)$, $\underline{U}b(t2)$, $\underline{U}c(t2)$ differ from one another by more than a predetermined amount RAB, RBC, RCA, Step 104 is performed, otherwise continuation is with Step 111.

Step 111: Determination of the phase angles φa, φb, φc of the second mains voltage phasors $\underline{U}a(t2)$, $\underline{U}b(t2)$, $\underline{U}c(t2)$ at the instant t2, wherein (pa is the phase angle of the mains voltage phasor $\underline{U}a(t2)$, φb is the phase angle of the mains voltage phasor $\underline{U}b(t2)$ and φc is the phase angle of the mains voltage phasor $\underline{U}c(t2)$.

Step 112: Comparison of the phase angles φa(t2), φb(t2), φc(t2) of the second mains voltage phasors $\underline{U}a(t2)$, $\underline{U}b(t2)$, $\underline{U}c(t2)$ at the instant t2 analogously to Step 106.

If the phase angles of the second mains voltage phasors differ from one another by more than a predetermined amount PAB, PBC, PCA Step 104b is performed, otherwise continuation is with Step 113.

Step 104b: A warning signal is generated, which indicates a short-circuit in the power mains and/or a too-strong or excessive asymmetry of the mains voltages Ua, Ub, Uc. Subsequently, a jump to Step 109 takes place according to need.

Step 113: Second foil voltage phasors $\underline{V}a(t2)$, $\underline{V}b(t2)$, $\underline{V}c(t2)$ for the instant t2 are determined on the basis of a measured foil voltage present between the respective foil 3 and ground potential 13 at the instant t2. In addition, the respective phase offset θab (t2), θbc (t2), θac (t2) between the adjacent capacitor bushings is determined for the instant t2 from the foil voltage phasors $\underline{V}a(t2)$, $\underline{V}b(t2)$, $\underline{V}c(t2)$ in accordance with the following equations and is archived:

$$\theta_{ab}(t_j) = \left(\arccos\frac{\underline{V}_a(t_j)\cdot\underline{V}_b(t_j)}{|\underline{V}_a(t_j)|\cdot|\underline{V}_b(t_j)|} - \arccos\frac{\underline{U}_a(t_j)\cdot\underline{U}_b(t_j)}{|\underline{U}_a(t_j)|\cdot|\underline{U}_b(t_j)|}\right),$$
$$j = 2$$

$$\theta_{bc}(t_j) = \left(\arccos\frac{\underline{V}_b(t_j)\cdot\underline{V}_c(t_j)}{|\underline{V}_b(t_j)|\cdot|\underline{V}_c(t_j)|} - \arccos\frac{\underline{U}_b(t_j)\cdot\underline{U}_c(t_j)}{|\underline{U}_b(t_j)|\cdot|\underline{U}_c(t_j)|}\right),$$
$$j = 2$$

$$\theta_{ca}(t_j) = \left(\arccos\frac{\underline{V}_c(t_j)\cdot\underline{V}_a(t_j)}{|\underline{V}_c(t_j)|\cdot|\underline{V}_a(t_j)|} - \arccos\frac{\underline{U}_c(t_j)\cdot\underline{U}_a(t_j)}{|\underline{U}_c(t_j)|\cdot|\underline{U}_a(t_j)|}\right),$$
$$j = 2$$

Any measurement values from possible previous performances of the method undertaken between an instant t1 and an instant t2 are not taken into consideration in this form of embodiment.

Step 114a: In this form of embodiment a loss factor change ΔDa, ΔDb, ΔDc is calculated for each capacitor bushing 2a, 2b, 2c in dependence on the phase offset θab (tj), θbc (tj), θac (tj), which was previously determined at different instants, between the adjacent capacitor bushings in accordance with the following equation:

$$\Delta D_a(t_2) = \theta_{ab}(t_2) - \theta_{ab}(t_1)$$

$$\Delta D_b(t_2) = \theta_{bc}(t_2) - \theta_{bc}(t_1)$$

$$\Delta D_c(t_2) = \theta_{ca}(t_2) - \theta_{ca}(t_1)$$

ΔDa (t2) thus describes the loss factor change of the capacitor bushing 2a at the instant t2 by comparison with the instant t1. ΔDb (t2) describes the loss factor change of the capacitor bushing 2b at the instant t2 by comparison with the instant t1. ΔDc(t2) describes the loss factor change of the capacitor bushing 2c at the instant t2 by comparison with the instant t1.

According to this form of embodiment, determination of the loss factor change of the capacitor bushings 2a, 2b, 2c is also carried out for later instants t3, t4, . . . , tn, which lie after the instant t2, with reference to the first instant t1.

Step 115: For each capacitor bushing, the loss factor changes, which were identified in Step 114a, of the capacitor bushings 2a, 2b, 2c are compared. In this form of embodiment it is provided that the tolerance values DA>0, DB>0, DC>0 are determined for the loss factor change of the respective capacitor bushings and the comparison is carried out in such a way that it is checked whether:

$$|\Delta D_a(t_2)| \leq D_A \text{ and } |\Delta D_b(t_2)| \leq D_B \text{ and } |\Delta D_c(t_2)| \leq D_C$$

If this is the case, Step 116 is carried out. If this is not the case, Step 117 is carried out.

Step 116: A monitoring signal is generated which indicates that the capacitor bushings 2a, 2b, 2c are in a proper state. Subsequently, there is a jump to Step 109.

Step 117: The loss factor comparison is in addition carried out in such a way that it is checked whether in a first case $$|\Delta D_a(t_2)| > D_A \text{ and } |\Delta D_b(t_2)| > D_B \text{ and } |\Delta D_c(t_2)| > D_C$$

or in a second case $|\Delta D_a(t_2)| \leq D_A$ and $|\Delta D_b(t_2)| > D_B$ and $|\Delta D_c(t_2)| > D_C$ or in a third case $|\Delta D_a(t_2)| > D_A$ and $|\Delta D_b(t_2)| \leq D_B$ and $|\Delta D_c(t_2)| > D_C$ If one of the three above-mentioned cases occurs, there is a jump to Step 118. If this is not the case, Step 119 is carried out.

Step 118: Depending on the loss comparison of Step 117, a monitoring signal is generated.

If in Step 117 the first case has arisen, the monitoring signal indicates that either the second capacitor bushing 2b is not in proper state or the two other capacitor bushings 2a, 2c are not in proper state and have a fault of the same kind.

If in Step 117 the second case has arisen, the monitoring signal indicates that either the third capacitor bushing 2c is not in proper state or the two other capacitor bushings 2b, 2a are not in proper state and have a fault of the same kind.

If in Step 117 the third case has arisen then the monitoring signal indicates that either the first capacitor bushing 2c is not in proper state or the two other capacitor bushings 2c, 2b are not in proper state and have a fault of the same kind.

Step 119: If none of the three above-mentioned cases occurs, a monitoring signal is generated which indicates that either all three capacitor bushings 2a, 2b, 2c are not in proper state or two capacitor bushings are not in proper state and do not have a fault of the same kind. Subsequently, the method is concluded (Step 120) or according to need a jump to Step 109 takes place.

In the following, alternative forms of embodiment 114b, 114c of the step 114a are explained in more detail.

By contrast to the procedure in Step 114a, in a Step 114b determination of the loss factor change of the respective capacitor bushing is carried out for measurement values at an instant t3, t4, ..., tn, which lies after the instant t2, also with reference to the preceding measurement value. This is represented, by way of example, for an instant t3, which lies after the instant t2, by the following equations:

$\Delta D_a(t_3) = \theta_{ab}(t_3) - \theta_{ab}(t_2)$ $\Delta D_b(t_3) = \theta_{bc}(t_3) - \theta_{bc}(t_2)$ $\Delta D_a(t_3) = \theta_{ca}(t_3) - \theta_{ca}(t_2)$.

In a further alternative form of embodiment, in a Step 114c the number of measurement values lying between a first instant t1 and a later instant tn can be utilised for determination of the loss factor change of the respective capacitor bushing. Advantageously, the individual measurement values t1, ..., tn can also be provided with a weighting factor. This form of embodiment of the Step 114c is represented, by way of example, on the basis of the following equations.

Thus, for determination of the loss factor change of a first capacitor bushing 2a:

$$\Delta D_a(t_n) = \sum_{i=2}^{n} \{g_{ai}[\theta_{ab}(t_i) - \theta_{ab}(t_{i-1})]\}$$

wherein $$\sum_{i=2}^{n} g_{ai} = 1$$

For determination of the loss factor change of a second capacitor bushing 2b:

$$\Delta D_b(t_n) = \sum_{i=2}^{n} \{g_{bi}[\theta_{bc}(t_i) - \theta_{bc}(t_{i-1})]\}$$

wherein $$\sum_{i=2}^{n} g_{bi} = 1$$

For determination of the loss factor change of a third capacitor bushing 2c:

$$\Delta D_c(t_n) = \sum_{i=2}^{n} \{g_{ci}[\theta_{ca}(t_i) - \theta_{ca}(t_{i-1})]\}$$

wherein $$\sum_{i=2}^{n} g_{ci} = 1$$

wherein n>2 is the number of the instants;

gai, gbi, gci are ith weighting factors for the first, second and third capacitor bushing.

In that case, the weighting factors can antitonically depend on the age of the respective capacitor bushing or the place of installation or statistical or probabilistic methods or further empirical values.

The Steps 102, 109 can be executed by, for example, the voltage converters 9a, 9b, 9c, the measuring adapters 6, the measuring devices 7 and the evaluating device 8, which thus form means configured in such a way that the means detect the mains voltages as well as foil voltages at different instants Ua(tj), Ub(tj), Uc(tj), Va(tj), Vb(tj), Vc(tj).

The Steps 103, 105, 106, 110, 111, 112 can be executed by, for example, the voltage converters 9a, 9b, 9c and the evaluating device 8, which thus form means configured in such a way that the means determine the mains voltage phasors at different instants and compare them with one another.

The Steps 104a, 104b, 116, 118, 119 can be executed by, for example, the evaluating device 8, which thus forms means configured in such a way that the means can generate a monitoring signal which depends on the results of the comparison of the mains voltages, phase positions and loss factor changes.

The Steps 107, 108, 113, 114a, 114b, 114c can be executed by, for example, the evaluating device 8, the measuring adapter 6 and the measuring device 7, which thus form means configured in such a way that the means can determine the foil voltage phasors at different instants and compare them with one another.

Steps 115, 117 can be executed by, for example, the evaluating device 8, which thus forms means configured in such a way that the means compare the changes in the loss factor of the respective capacitor bushing with one another.

Advantageously, the Steps 103/105 and/or the Steps 110. 112 are carried out in parallel with one another.

Figure 5:
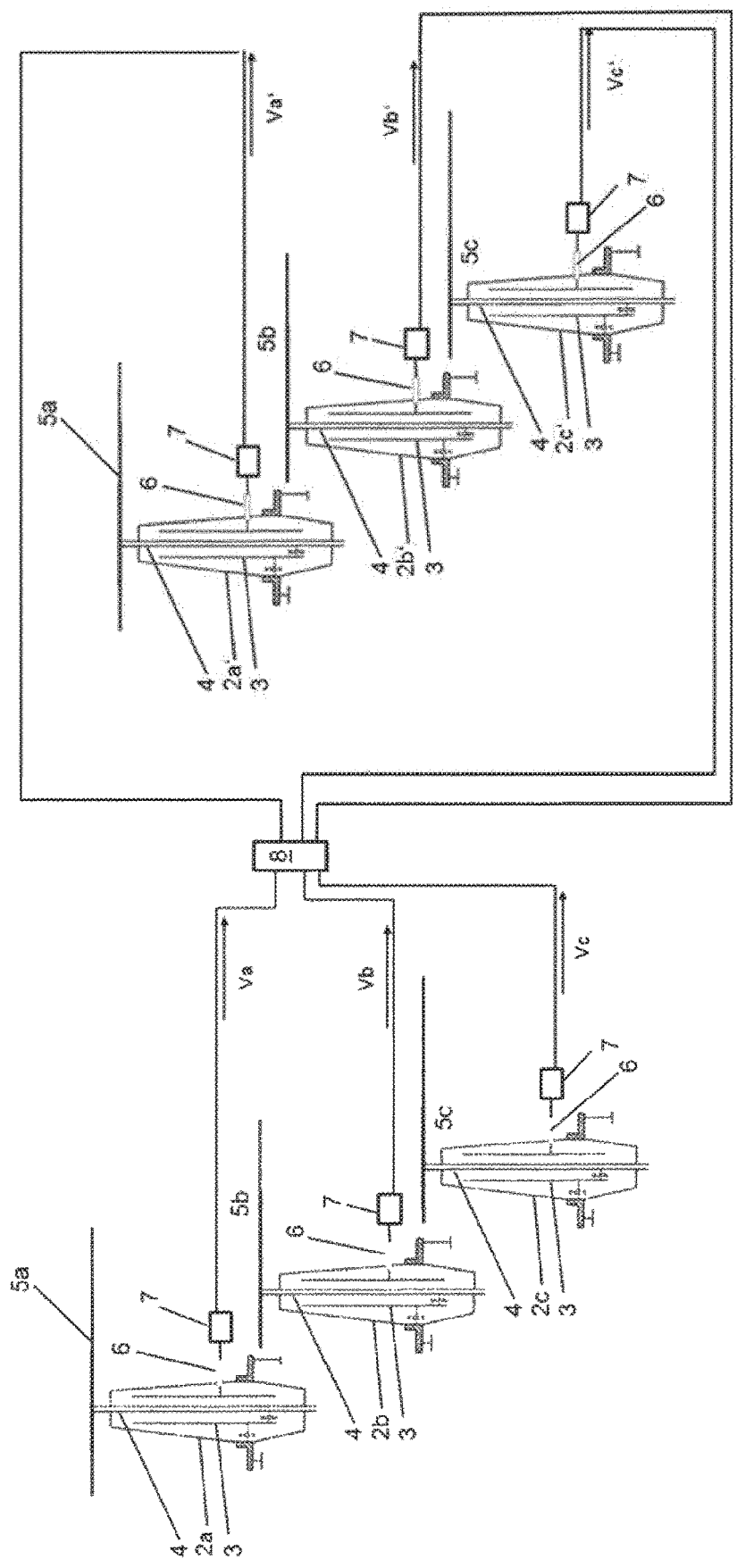
FIG. 5 shows a further form of embodiment of a device for monitoring capacitor bushings for a three-phase alternating current mains.

A further form of embodiment of a device for monitoring capacitor bushings for a three-phase alternating current mains is shown in FIG. 5. By contrast with the previous embodiments, here the reference voltage phasors Ra(tj), Rb(tj), Rc(tj) are—for comparison of the loss factor changes—determined not by a voltage divider 9a, 9b, 9c at the respective mains line 5a, 5b, 5c, but on the basis of a group of parallelly connected capacitor bushings 2a', 2b', 2c' at a second high-voltage transformer (not illustrated). The parallel capacitor bushings 2a', 2b', 2c' are in that case connected with the same mains line 5a, 5b, 5c as the capacitor bushings 2a, 2b, 2c.

Analogously to the embodiments with respect to FIG. 2, a measuring device consisting of a measuring adapter 6 and a measuring device 7 is associated with each parallel capacitor bushing 2a', 2b', 2c'. The evaluating device 8 is electrically conductively connected with the parallel capacitor bushings 2a', 2b', 2c' by way of the respective measuring device 7 and the respective measuring adapter 6. The foil voltage phasors $\underline{V}a'$, $\underline{V}b'$, $\underline{V}c'$ of the parallel capacitor bushings are determined by means of this connection.

In this alternative form of embodiment the foil voltage phasors $\underline{V}a'(tj)$, $\underline{V}b'(tj)$, $\underline{V}c'(tj)$ are used as reference voltage phasors $\underline{R}a(tj)$, $\underline{R}b(tj)$, $\underline{R}c(tj)$ for the method sequence.

The phase angles φa, φb, φc are replaced in the method sequence, which is presented in FIG. 5, by the phase angles φa', φb', φc' of the foil voltage phasors $\underline{V}a'$, $\underline{V}b'$, $\underline{V}c'$.

Analogously thereto, the tolerance values for the phase comparisons PAB, PBC, PCA as well as the tolerance values for the voltage comparisons RAB, RBC, RCA are replaced, if required, by alternative tolerance values for the phase comparison PAB', PBC', PCA' of the foil voltage phasors $\underline{V}a'$, $\underline{V}b'$, $\underline{V}c'$ as well as by alternative tolerance values RAB', RBC', RCA' for the voltage comparison on the basis of the parallel foil voltage phasors Va', Vb', Vc'.

In a further form of embodiment use can also be made, as reference voltages, of constant voltages which are predetermined for the corresponding constant voltage phasors.

The magnitude of each constant voltage phasor in this case preferably corresponds with the rated voltage value of the alternating current mains.

In this form of embodiment, the phase angles φa, φb, φc according to the method sequence described in the embodiments with respect to FIG. 5 are determined to be constant at 0°, 120°, 240°.

While the invention has been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

The following is a list of reference symbols used herein:
1 device
2a, 2b, 2c capacitor bushing
2a', 2b', 2c' parallel capacitor bushing
3 foil
4 conductor
5a, 5b, 5c mains line
6 measuring adapter
7 measuring device
7' overvoltage protection
8 evaluating device
9a, 9b, 9c voltage converter
11 insulating body
12 flange
13 ground potential
K1, K2 capacitors
W1, W2 windings
A, B, C first, second, third phase
Ra, Rb, Rc reference voltage
$\underline{R}a(tj)$, $\underline{R}b(tj)$, $\underline{R}c(tj)$ reference voltage phasor at instant tj
Ua, Ub, Uc mains voltage
$\underline{U}a(tj)$, $\underline{U}b(tj)$, $\underline{U}c(tj)$ mains voltage phasor at instant tj
Va, Vb, Vc foil voltage
$\underline{V}a(tj)$, $\underline{V}b(tj)$, $\underline{V}c(tj)$ foil voltage phasor at instant tj
Va', Vb', Vc' foil voltage at parallel capacitor bushings
$\underline{V}a'(tj)$, $\underline{V}b'(tj)$, $\underline{V}c'(tj)$ foil voltage phasor at parallel capacitor bushings
Uae, Ube, Uce effective values of the mains voltage
KO1, KO2, KO3 first, second, third upper-voltage capacitor
KU1, KU2, KU3 first, second, third lower-voltage capacitor
KA1, KA2, KA3 first, second, third outer capacitor
KM1, KM2, KM3 first, second, third measuring capacitor
C0a, C0b, C0c upper capacitance of KO1, KO2, KO3
C1a, C1b, C1c lower capacitance of KU1, KU2, KU3
CA1, CA2, CA3 capacitance of KA1, KA2, KA3
CM1, CM2, CM3 capacitance of KM1, KM2, KM3
θab, θbc, θac phase offset between foil voltage phasors $\underline{V}a$, $\underline{V}b$, $\underline{V}c$
ΔDa, ΔDb, ΔDc loss factor change of the capacitor bushing
DA, DB, DC tolerance values for loss factor change
PAB, PBC, PCA tolerance values for phase comparisons
RAB, RBC, RCA tolerance values for voltage comparisons
φa, φb, φc phase angle of the reference voltage phasor
gai, gbi, gci weighting factors

The invention claimed is:

1. A method of monitoring capacitor bushings for an alternating current mains,
   wherein the alternating current mains has a first phase, second phase, and third phase and comprises:
   a first mains line, with which the first phase and a first capacitor bushing are associated and at which a first mains voltage is present,
   a second mains line, with which the second phase and a second capacitor bushing are associated and at which a second mains voltage is present, and
   a third mains line, with which the third phase and a third capacitor bushing are associated and at which a third mains voltage is present;
   wherein each of the first capacitor bushing, the second capacitor bushing, and the third capacitor bushing comprises:

a conductor connected with the associated one of the first mains line, the second mains line, or the third mains line; and
an electrically conductive foil surrounding the conductor;
wherein the method comprises:
at a predetermined first instant, for each of the first phase, the second phase, and the third phase:
a corresponding first reference voltage phasor is determined for a first reference voltage; and
a foil voltage present between the respective foil and ground potential is detected and a corresponding first foil voltage phasor is determined;
at a predetermined second instant lying after the first instant, for each of the first phase, the second phase, and the third phase:
a corresponding second reference voltage phasor is determined for a second reference voltage;
the foil voltage is detected and a corresponding second foil voltage phasor is determined;
for each of the first capacitor bushing, the second capacitor bushing, and the third capacitor bushing:
a loss factor change is calculated in dependence on the respective first reference voltage phasor and the second reference voltage phasor and the first foil voltage phasor and the second foil voltage phasor of the respective one of the first capacitor bushing, the second capacitor bushing, and the third capacitor bushing as well as in dependence on the first reference voltage phasor and the second reference voltage phasor and the first foil voltage phasor and the second foil voltage phasor of a respectively adjacent capacitive bushing which is one of the first capacitor bushing, the second capacitor bushing, and the third capacitor bushing;
the loss factor change is compared with a tolerance value; and
a monitoring signal is generated in dependence on the results of the loss factor comparisons,
wherein the loss factor change of the first capacitor bushing is calculated in accordance with the following equation:

$$\Delta D_a(t_2) = \theta_{ab}(t_2) - \theta_{ab}(t_1), \text{ wherein}$$

$$\theta_{ab}(t_j) = \left( \arccos \frac{\underline{V}_a(t_j) \cdot \underline{V}_b(t_j)}{|\underline{V}_a(t_j)| \cdot |\underline{V}_b(t_j)|} - \arccos \frac{\underline{R}_a(t_j) \cdot \underline{R}_b(t_j)}{|\underline{R}_a(t_j)| \cdot |\underline{R}_b(t_j)|} \right),$$

$$j = 1, 2,$$

and/or
wherein the loss factor change of the second capacitor bushing is calculated in accordance with the following equation:

$$\Delta D_b(t_2) = \theta_{bc}(t_2) - \theta_{bc}(t_1), \text{ wherein}$$

$$\theta_{bc}(t_j) = \left( \arccos \frac{\underline{V}_b(t_j) \cdot \underline{V}_c(t_j)}{|\underline{V}_b(t_j)| \cdot |\underline{V}_c(t_j)|} - \arccos \frac{\underline{R}_b(t_j) \cdot \underline{R}_c(t_j)}{|\underline{R}_b(t_j)| \cdot |\underline{R}_c(t_j)|} \right),$$

$$j = 1, 2,$$

and/or
wherein the loss factor change of the third capacitor bushing is calculated in accordance with the following equation:

$$\Delta D_c(t_2) = \theta_{ca}(t_2) - \theta_{ca}(t_1), \text{ wherein}$$

$$\theta_{ca}(t_j) = \left( \arccos \frac{\underline{V}_c(t_j) \cdot \underline{V}_a(t_j)}{|\underline{V}_c(t_j)| \cdot |\underline{V}_a(t_j)|} - \arccos \frac{\underline{R}_c(t_j) \cdot \underline{R}_a(t_j)}{|\underline{R}_c(t_j)| \cdot |\underline{R}_a(t_j)|} \right),$$

$$j = 1, 2,$$

wherein Ra(t1), Rb(t1), Rc(t1) are respectively the first reference voltage phasor of the first phase, the second phase, and the third phase,
wherein Va(t1), Vb(t1), Vc(t1) are respectively the first foil voltage phasor of the first phase, the second phase, and third phase,
wherein Ra(t2), Rb(t2), Rc(t2) are respectively the second reference voltage phasor of the first phase, the second phase, and the third phase, and
wherein Va(t2), Vb(t2), Vc(t2) are respectively the second foil voltage phasor of the first phase, the second phase, and the third phase.

2. The method according to claim 1, wherein each of the first reference voltage and the second reference voltage is the respective one of the first mains voltage, the second mains voltage, or the third mains voltage.

3. The method according to claim 1, wherein:
a first parallel capacitor bushing is associated with the first mains line;
a second parallel capacitor bushing is associated with the second mains line;
a third parallel capacitor bushing is associated with the third mains line;
each of the first parallel capacitor bushing, the second parallel capacitor bushing, and the third parallel capacitor bushing comprises:
a parallel-capacitor-bushing conductor connected with the associated one of the first mains line, the second mains line, or the third mains line, and
a parallel-capacitor-bushing electrically conductive foil surrounding the conductor;
for each of the first phase, the second phase, and the third phase, the first reference voltage and the second reference voltage are the first foil voltage and the second foil voltage respectively present at the first instant and the second instant between the foil and ground potential of the respective one of the first parallel capacitor bushing, the second parallel capacitor bushing, or the third parallel capacitor bushing.

4. The method according to claim 1, wherein for each of the first phase, the second phase, and the third phase, each of the first reference voltage and the second reference voltage is a constant voltage for which a corresponding one of a constant voltage phasor and a second constant voltage phasor is predetermined.

5. The method according to claim 4, wherein:
a magnitude of each of the first constant voltage phasor and the second constant voltage phasor is equal to a rated voltage value of the alternating current mains;
for the first phase, a phase angle of the first constant voltage phasor and the second constant voltage phasor is 0°;
for the second phase, a phase angle of the first constant voltage phasor and the second constant voltage phasor is 120°; and for the third phase, a phase angle of the first constant voltage phasor and the second constant voltage phasor is 240°.

6. The method according to claim 1,
wherein tolerance values DA>0, DB>0, DC>0 are determined for the loss factor comparisons; and
wherein if the loss factor comparisons have the result that:

$|\Delta D_a(t_2)| \leq D_A$ and $|\Delta D_b(t_2)| \leq D_B$ and $|\Delta D_c(t_2)| \leq D_C$ then the monitoring signal is generated which indicates that the first capacitor bushing, the second capacitor bushing, and the third capacitor bushing are in a state of proper order.

7. The method according to claim 1,
wherein tolerance values DA>0, DB>0, DC>0 are determined for the loss factor comparisons;
wherein if the loss factor comparisons have the result that:

$|\Delta D_a(t_2)| > D_A$ and $|\Delta D_b(t_2)| > D_B$ and $|\Delta D_c(t_2)| \leq D_C$ then the monitoring signal is generated which indicates that either the second capacitor bushing is not in a state of proper order or the first capacitor bushing and the third capacitor bushing are not in the state of proper order and have a fault of the same kind;
wherein if the loss factor comparisons have the result that:

$|\Delta D_a(t_2)| D_A$ and $|\Delta D_b(t_2)| > D_B$ and $|\Delta D_c(t_2)| > D_C$ then the monitoring signal is generated which indicates that either the third capacitor bushing is not in the state of proper order or the first capacitor bushing and the second capacitor bushing are not in the state of proper order and have the fault of the same kind; and
wherein if the loss factor comparisons have the result that:

$|\Delta D_a(t_2)| > D_A$ and $|\Delta D_b(t_2)| \leq D_B$ and $|\Delta D_c(t_2)| > D_C$ then the monitoring signal is generated which indicates that either the first capacitor bushing is not in the state of proper order or the second capacitor bushing and the third capacitor bushing are not in the state of proper order and have the fault of the same kind.

8. The method according to claim 7, wherein otherwise the monitoring signal is generated which indicates that either all the first capacitor bushing, the second capacitor bushing, and the third capacitor bushing are not in the state of proper order or two of the first capacitor bushing, the second capacitor bushing, and the third capacitor bushing are not in the state of proper order and do not have the fault of the same kind.

9. The method according to claim 1,
wherein at a predetermined third instant lying after the second instant, for each of the first phase, the second phase, and the third phase:
a corresponding third reference voltage phasor is determined for a third reference voltage;
the foil voltage is detected and a corresponding third foil voltage phasor is determined; and
the second reference voltage phasor is replaced by the third reference voltage phasor and the second foil voltage phasor is replaced by the third foil voltage phasor;
for each of the first capacitor bushing, the second capacitor bushing, and the third capacitor bushing:
the calculation and comparison of the loss factor change are repeated; and
the monitoring signal is generated in dependence on the results of these loss factor comparisons.

10. The method according to claim 9, wherein before each replacement of the second reference voltage phasor and foil voltage phasor, the first reference voltage phasor is replaced by the second reference voltage phasor and the first foil voltage phasor is replaced by the second foil voltage phasor.

11. The method according to claim 1,
wherein at at least one predetermined later instant lying after the second instant, for each of the first phase, the second phase, and the third phase:
a corresponding later reference voltage phasor is determined for a later reference voltage;
the foil voltage is detected and a corresponding later foil voltage phasor is determined; and
wherein for each of the first capacitor bushing, the second capacitor bushing, and the third capacitor bushing:
the calculation of the loss factor change additionally depends on the respective later mains voltage phasors and the foil voltage phasors.

12. The method according to claim 1,
wherein at at least one predetermined later instant lying after the second instant, for each of the first phase, the second phase, and the third phase:
a later reference voltage phasor is determined; and
the foil voltage is detected and a corresponding later foil voltage phasor is determined;
wherein for each of the first capacitor bushing, the second capacitor bushing, and the third capacitor bushing:
the loss factor change is calculated in dependence on the respective first reference voltage phasor, the second reference voltage phasor, and the later reference voltage phasor and the first foil voltage phasor, the second foil voltage phasor, and the later foil voltage phasor as well as on the first reference voltage phasor, the second reference voltage phasor, and the later reference voltage phasor and the first foil voltage phasor, the second foil voltage phasor, and the third foil voltage phasor of the respectively adjacent capacitor bushing; and
the loss factor change is compared with a tolerance value; and
the monitoring signal is generated in dependence on the results of these loss factor comparisons.

13. The method according to claim 1, wherein:
between a determination of the first reference voltage phasor and determination of the first foil voltage phasor for each of the first phase, the second phase, and the third phase:
magnitudes of the first reference voltage phasor for each of the first phase, the second phase, and the third phase are compared with one another,
determination of the first foil voltage phasor for each of the first phase, the second phase, and the third phase is carried out if the magnitude comparisons have a result that the magnitudes do not differ from one another by more than a predetermined amount; and/or
between a determination of the second reference voltage phasor and determination of the second foil voltage phasor for each of the first phase, the second phase, and the third phase:
magnitudes of the second reference voltage phasor for each of the first phase, the second phase, and the third phase are compared with one another,
a determination of the second foil voltage phasor for each of the first phase, the second phase, and the third phase is carried out if the magnitude comparisons have a result that the magnitudes do not differ from one another by more than a predetermined amount.

14. The method according to claim 1, wherein:
between determination of the first reference voltage phasor and determination of the first foil voltage phasor for each of the first phase, the second phase, and the third phase:
  phase angles of the first reference voltage phasor for each of the first phase, the second phase, and the third phase are compared with one another,
  a determination of the first foil voltage phasor for each of the first phase, the second phase, and the third phase is carried out if the angle comparisons have a result that the phase angles do not differ from one another by more than a predetermined amount;
between a determination of the second reference voltage phasor and a determination of the second foil voltage phasor for each of the first phase, the second phase, and the third phase:
  the phase angles of the second reference voltage phasor for each of the first phase, the second phase, and the third phase are compared with one another, and
  a determination of the second foil voltage phasor for each of the first phase, the second phase, and the third phase is carried out if the angle comparisons have a result that the phase angles do not differ from one another by more than a predetermined amount.

15. A method of monitoring capacitor bushings for an alternating current mains,
  wherein the alternating current mains has a first phase, second phase, and third phase and comprises:
    a first mains line, with which the first phase and a first capacitor bushing are associated and at which a first mains voltage is present,
    a second mains line, with which the second phase and a second capacitor bushing are associated and at which a second mains voltage is present, and
    a third mains line, with which the third phase and a third capacitor bushing are associated and at which a third mains voltage is present,
  wherein each of the first capacitor bushing, the second capacitor bushing, and the third capacitor bushing comprises:
    a conductor connected with the associated one of the first mains line, the second mains line, or the third mains line; and
    an electrically conductive foil surrounding the conductor;
  wherein the method comprises:
    at a predetermined first instant, for each of the first phase, the second phase, and the third phase:
      a corresponding first reference voltage phasor is determined for a first reference voltage; and
      a foil voltage present between the respective foil and ground potential is detected and a corresponding first foil voltage phasor is determined;
    at a predetermined second instant lying after the first instant, for each of the first phase, the second phase, and the third phase:
      a corresponding second reference voltage phasor is determined for a second reference voltage;
      the foil voltage is detected and a corresponding second foil voltage phasor is determined;
    for each of the first capacitor bushing, the second capacitor bushing, and the third capacitor bushing:
      a loss factor change is calculated in dependence on the respective first reference voltage phasor and the second reference voltage phasor and the first foil voltage phasor and the second foil voltage phasor of the respective one of the first capacitor bushing, the second capacitor bushing, and the third capacitor bushing as well as in dependence on the first reference voltage phasor and the second reference voltage phasor and the first foil voltage phasor and the second foil voltage phasor of a respectively adjacent capacitive bushing which is one of the first capacitor bushing, the second capacitor bushing, and the third capacitor bushing;
      the loss factor change is compared with a tolerance value; and
    a monitoring signal is generated in dependence on the results of the loss factor comparisons,
  wherein at at least one predetermined later instant lying after the second instant, for each of the first phase, the second phase, and the third phase:
    a corresponding later reference voltage phasor is determined for a later reference voltage;
    the foil voltage is detected and a corresponding later foil voltage phasor is determined; and
  wherein for each of the first capacitor bushing, the second capacitor bushing, and the third capacitor bushing:
    the calculation of the loss factor change additionally depends on the respective later mains voltage phasors and the foil voltage phasors,
  wherein the loss factor change of the first capacitor bushing is calculated in accordance with the following equation:

$$\Delta D_a(t_n) = \sum_{i=2}^{n} \{g_{ai}[\theta_{ab}(t_i) - \theta_{ab}(t_{i-1})]\},$$

wherein $$\theta_{ab}(t_j) = \arccos \frac{\underline{V}_a(t_j) \cdot \underline{V}_b(t_j)}{|\underline{V}_a(t_j)| \cdot |\underline{V}_b(t_j)|} - \arccos \frac{\underline{R}_a(t_j) \cdot \underline{R}_b(t_j)}{|\underline{R}_a(t_j)| \cdot |\underline{R}_b(t_j)|},$$

$$j = 1, \ldots, n$$

$$\sum_{i=2}^{n} g_{ai} = 1,$$

and/or
  wherein the loss factor change of the second capacitor bushing is calculated in accordance with the following equation:

$$\Delta D_b(t_n) = \sum_{i=2}^{n} \{g_{bi}[\theta_{bc}(t_i) - \theta_{bc}(t_{i-1})]\},$$

wherein $$\theta_{bc}(t_j) = \arccos \frac{\underline{V}_b(t_j) \cdot \underline{V}_c(t_j)}{|\underline{V}_b(t_j)| \cdot |\underline{V}_c(t_j)|} - \arccos \frac{\underline{R}_b(t_j) \cdot \underline{R}_c(t_j)}{|\underline{R}_b(t_j)| \cdot |\underline{R}_c(t_j)|},$$

$$j = 1, \ldots, n$$

$$\sum_{i=2}^{n} g_{bi} = 1,$$

and/or
  wherein the loss factor change of the third capacitor bushing is calculated in accordance with the following equation:

$$\Delta D_c(t_n) = \sum_{i=2}^{n} \{g_{ci}[\theta_{ca}(t_i) - \theta_{ca}(t_{i-1})]\},$$

wherein $$\theta_{ca}(t_j) = \arccos \frac{\underline{V}_c(t_j) \cdot \underline{V}_a(t_j)}{|\underline{V}_c(t_j)| \cdot |\underline{V}_a(t_j)|} - \arccos \frac{\underline{R}_c(t_j) \cdot \underline{R}_a(t_j)}{|\underline{R}_c(t_j)| \cdot |\underline{R}_a, (t_j)|},$$

$$j = 1, \ldots, n$$

$$\sum_{i=2}^{n} g_{ci} = 1;$$

wherein n>2 is the number of the instants;
wherein t1, t2 are the first and second instants and t3, to are the later instants; and
wherein gai, gbi, gci are ith weighting factors for the first capacitor bushing, the second capacitor bushing, and the third capacitor bushing.

16. The method according to claim 15, wherein:
each weighting factor antitonically depends on the age of the respective instant; and/or
there applies for the weighting factors:

$$g_{ai-1} \leq g_{ai} \text{ and/or } g_{bi-1} \leq g_{bi} \text{ and/or } g_{ci-1} \leq g_{ci} \text{ for } i=2, \ldots, n.$$

17. A device for monitoring capacitor bushings for an alternating current mains,
the alternating current mains having a plurality of phases that comprises a first phase, a second phase, and a third phase, and the alternating current mains comprising:
a first mains line of a plurality of mains lines, with which the first phase and a first capacitor bushing of the capacitor bushings are associated and at which a first mains voltage is present,
a second mains line of the mains lines, with which the second phase and a second capacitor bushing of the capacitor bushings are associated and at which a second mains voltage is present, and
a third mains line of the mains lines, with which the third phase and a third capacitor bushing of the capacitor bushings are associated and at which a third mains voltage is present,
each of the capacitor bushings comprising:
a conductor connected with the associated one of the mains lines;
an electrically conductive foil surrounding the conductor; and
the device comprising:
a first voltage converter, of a plurality of voltage converters, which is configured to be connected with the first mains line;
a second voltage converter, of the voltage converters, which is configured to be connected with the second mains line;
a third voltage converter, of the voltage converters, which is configured to be connected with the third mains line;
a first measuring adapter, of a plurality of measuring adapters, which is configured to be connected with the foil of the first capacitor bushing;
a second measuring adapter, of the measuring adapters, which is configured to be connected with the foil of the second capacitor bushing;
a third measuring adapter, of the measuring adapters, which is configured to be connected with the foil of the third capacitor bushing;
a measuring device coupled to the measuring adapters; and
an evaluating device coupled to the voltage converters and the measuring device;
wherein each of the voltage converters for the respective one of the phases can detect the respective one of the first main voltage, the second main voltage, or the third main voltage;
wherein the measuring device for each of the phases can detect, with the help of the respective one of the measuring adapters, a foil voltage present between the respective foil and a ground potential;
wherein the evaluating device is so constructed that at a predetermined first instant, for each of the phases it is configured to:
detect the respective one of the first mains voltage, the second mains voltage, or the third mains voltage with the help of the respective one of the voltage converters and determine a corresponding first mains voltage phasor; and
detect the foil voltage with the help of the measuring device and determine a corresponding first foil voltage phasor;
wherein the evaluating device is so constructed that at a predetermined second instant lying after the first instant, for each of the phases it is configured to:
detect the respective one of the first mains voltage, the second mains voltage, or the third mains voltage with the help of the respective one of the voltage converters and determine a corresponding second mains voltage phasor;
detect the foil voltage with the help of the measuring device and determine a corresponding second foil voltage phasor;
wherein the evaluating device is so constructed that for each of the capacitor bushings it is configured to:
calculate a loss factor change in dependence on the respective first mains voltage phasor and the second mains voltage phasor and the first foil voltage phasor and the second foil voltage phasor of the respective one of the capacitor bushings as well as on the first mains voltage phasor and the second mains voltage phasor and the first foil voltage phasor and the second foil voltage phasor of a respectively adjacent one of the capacitor bushings;
compare the loss factor change with a tolerance value; and
wherein the evaluating device is so constructed that it is configured to generate a monitoring signal in dependence on the results of the loss factor comparisons
wherein the loss factor change of the first capacitor bushing is calculated in accordance with the following equation:

$$\Delta D_a(t_2) = \theta_{ab}(t_2) - \theta_{ab}(t_1), \text{ wherein}$$

$$\theta_{ab}(t_j) = \left( \arccos \frac{V_a(t_j) \cdot V_b(t_j)}{|V_a(t_j)| \cdot |V_b(t_j)|} - \arccos \frac{R_a(t_j) \cdot R_b(t_j)}{|R_a(t_j)| \cdot |R_b(t_j)|} \right), j = 1, 2,$$

and/or
wherein the loss factor change of the second capacitor bushing is calculated in accordance with the following equation:

$$\Delta D_b(t_2) = \theta_{bc}(t_2) - \theta_{bc}(t_1), \text{ wherein}$$

$$\theta_{bc}(t_j) = \left( \arccos \frac{V_b(t_j) \cdot V_c(t_j)}{|V_b(t_j)| \cdot |V_c(t_j)|} - \arccos \frac{R_b(t_j) \cdot R_c(t_j)}{|R_b(t_j)| \cdot |R_c(t_j)|} \right), j = 1, 2,$$

and/or
wherein the loss factor change of the third capacitor bushing is calculated in accordance with the following equation:

$$\Delta D_c(t_2) = \theta_{ca}(t_2) - \theta_{ca}(t_1), \text{ wherein}$$

$$\theta_{ca}(t_j) = \left( \arccos \frac{V_c(t_j) \cdot V_a(t_j)}{|V_c(t_j)| \cdot |V_a(t_j)|} - \arccos \frac{R_a(t_j) \cdot R_a(t_j)}{|R_c(t_j)| \cdot |R_a(t_j)|} \right), j = 1, 2,$$

wherein Ra(t1), Rb(t1), Rc(t1) are respectively the first mains voltage phasor of the first phase, the second phase, and the third phase,
wherein Va(t1), Vb(t1), Vc(t1) are respectively the first foil voltage phasor of the first phase, the second phase, and third phase,
wherein Ra(t2), Rb(t2), Rc(t2) are respectively the second mains voltage phasor of the first phase, the second phase, and the third phase, and
wherein Va(t2), Vb(t2), Vc(t2) are respectively the second foil voltage phasor of the first phase, the second phase, and the third phase.

* * * * *